(12) United States Patent
Roy et al.

(10) Patent No.: US 12,356,686 B2
(45) Date of Patent: Jul. 8, 2025

(54) DEVICES RELATED TO SWITCH BODY CONNECTIONS TO ACHIEVE SOFT BREAKDOWN

(71) Applicant: SKYWORKS SOLUTIONS, INC., Irvine, CA (US)

(72) Inventors: Ambarish Roy, Waltham, MA (US); Guillaume Alexandre Blin, Carlisle, MA (US); Nuttapong Srirattana, Billerica, MA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/640,616

(22) Filed: Apr. 19, 2024

(65) Prior Publication Data

US 2024/0347600 A1 Oct. 17, 2024

Related U.S. Application Data

(60) Continuation of application No. 18/143,082, filed on May 4, 2023, now Pat. No. 11,973,115, which is a (Continued)

(51) Int. Cl.
*H10D 62/17* (2025.01)
*H01L 23/66* (2006.01)
*H10D 30/67* (2025.01)

(52) U.S. Cl.
CPC .......... *H10D 62/357* (2025.01); *H01L 23/66* (2013.01); *H10D 30/6743* (2025.01)

(58) Field of Classification Search
CPC ............... H01L 23/66; H01L 29/78651; H01L 27/1203; H01L 29/66772; H01L 29/78615; H01L 29/1075; H01L 21/31051; H01L 29/495; H01L 29/4238; H01L 29/4966; H01L 29/66568; H01L 29/42356; H01L 21/76224; H01L 29/0847; H01L 29/42376; H01L 21/28123; H01L 29/7833; H01L 29/4916; H01L 29/0649; H01L 21/823828; H01L 21/266; H01L 2223/6655; H01L 2223/6677; H01L 2924/1421; H01L 2221/68318; H01L 2224/48227; H01L 2224/48091; H01L 2924/00014; H01L 2224/94; H01L 2224/03; H01L 2224/45099; H01L 2924/13091; H04B 1/40

See application file for complete search history.

(56) References Cited

U.S. PATENT DOCUMENTS 8,723,260 B1 * 5/2014 Carroll .................... H01L 21/84
257/401
10,115,787 B1 10/2018 Paul et al.
(Continued)

*Primary Examiner* — Mouloucoulaye Inoussa
(74) *Attorney, Agent, or Firm* — Chang & Hale LLP

(57) ABSTRACT

Devices and methods for switch body connections to achieve soft breakdown. In some embodiments, a radio-frequency switching device can include an assembly of source, gate, and drain implemented on an active region, a first body contact implemented at a first end of the assembly, and a second body contact implemented at a second end of the assembly. The second end can be distal from the first end along a width of the radio-frequency switching device.

12 Claims, 11 Drawing Sheets

Related U.S. Application Data continuation of application No. 17/146,334, filed on Jan. 11, 2021, now Pat. No. 11,682,699, which is a division of application No. 16/236,293, filed on Dec. 28, 2018, now abandoned.

(60) Provisional application No. 62/612,607, filed on Dec. 31, 2017.

(56) References Cited

U.S. PATENT DOCUMENTS

| | | | |
|---|---|---|---|
| 10,319,854 B1 | 6/2019 | Paul et al. | |
| 2001/0045602 A1 | 11/2001 | Maeda et al. | |
| 2002/0014665 A1 | 2/2002 | Lee et al. | |
| 2002/0195623 A1 | 12/2002 | Horiuchi | |
| 2006/0157791 A1 | 7/2006 | Lee et al. | |
| 2009/0052099 A1 | 2/2009 | Chee et al. | |
| 2009/0278207 A1 | 11/2009 | Greenberg et al. | |
| 2012/0074496 A1* | 3/2012 | Jalilizeinali | H01L 29/6609 257/288 |
| 2012/0205744 A1 | 8/2012 | O et al. | |
| 2012/0256274 A1 | 10/2012 | Riess et al. | |
| 2012/0267719 A1 | 10/2012 | Brindle et al. | |
| 2014/0042506 A1 | 2/2014 | Ramberg et al. | |
| 2014/0103440 A1 | 4/2014 | Chatterjee | |
| 2014/0242760 A1 | 8/2014 | Carroll et al. | |
| 2015/0171809 A1 | 6/2015 | Song | |
| 2015/0171898 A1 | 6/2015 | Blin et al. | |
| 2016/0005729 A1 | 1/2016 | O'Sullivan et al. | |
| 2016/0064561 A1* | 3/2016 | Brindle | H03K 17/162 257/348 |
| 2016/0322385 A1 | 11/2016 | Fuh et al. | |
| 2016/0336278 A1 | 11/2016 | Petzold et al. | |
| 2016/0336991 A1 | 11/2016 | Mason et al. | |
| 2016/0379983 A1 | 12/2016 | Yen et al. | |
| 2017/0170177 A1 | 6/2017 | Tasbas et al. | |
| 2017/0287813 A1 | 10/2017 | Wang et al. | |
| 2018/0061985 A1 | 3/2018 | Brindle et al. | |
| 2018/0091131 A1* | 3/2018 | Wang | H03K 17/693 |
| 2019/0109570 A1* | 4/2019 | Vedula | H01L 23/66 |
| 2019/0207003 A1 | 7/2019 | Radosavljevic et al. | |

* cited by examiner

DEVICES RELATED TO SWITCH BODY CONNECTIONS TO ACHIEVE SOFT BREAKDOWN

CROSS-REFERENCE TO RELATED APPLICATIONS

This application is a continuation of U.S. patent application Ser. No. 18/143,082, filed May 4, 2023, entitled "METHODS RELATED TO SWITCH BODY CONNECTIONS TO ACHIEVE SOFT BREAKDOWN," which is a continuation of U.S. patent application Ser. No. 17/146,334, filed Jan. 11, 2021, entitled "SWITCH BODY CONNECTIONS TO ACHIEVE SOFT BREAKDOWN," now U.S. Pat. No. 11,682,699, issued Jun. 20, 2023, which is a division of U.S. patent application Ser. No. 16/236,293, filed Dec. 28, 2018, entitled "SWITCH BODY CONNECTIONS TO ACHIEVE SOFT BREAKDOWN," now abandoned, which claims the benefit of U.S. Provisional Application No. 62/612,607, filed on Dec. 31, 2017, entitled "SWITCH BODY CONNECTIONS TO ACHIEVE SOFT BREAKDOWN," each of which is incorporated herein by reference in its entirety.

BACKGROUND

Field

The present disclosure generally relates to switches for high-power applications such as antenna tuning, as well as low-power applications.

Description of the Related Art

Switches for high-power applications such as antenna tuning, as well as low-power applications may include field-effect transistor (FET) devices and more particularly enhancements to body contacts for such FET devices. In electronics applications, field-effect transistors (FETs) can also be utilized in amplifiers. Switches can allow, for example, routing of radio-frequency (RF) signals in wireless devices. Amplifiers can amplify signals for transmission or amplify received signals.

SUMMARY

According to some implementations, the present disclosure relates to a field-effect transistor (FET) that includes an assembly of source, gate, and drain implemented on an active region, a first body contact implemented at a first end of the assembly, and a second body contact implemented at a second end of the assembly. The second end is distal from the first end along a width of the field-effect transistor.

In some embodiments, the first body contact and the second body contact are positioned substantially symmetrically about a center line of the field-effect transistor.

In some embodiments, the first body contact and the second body contact are coupled to a diode.

In some embodiments, the diode is a P-N junction diode.

In some embodiments, the diode is a PMOS field-effect transistor.

In some embodiments, the field-effect transistor includes a silicon-on-insulator (SOI) substrate.

In some embodiments, the active region is substantially the same size as an active region of a similar field-effect transistor including a single body contact.

In some embodiments, each of the source, gate, and drain of the assembly is implemented in a finger configuration with gate fingers extending in a direction such that the first body contact is implemented proximate to a first end of a gate finger and the second body contact is implemented proximate to a second end of the gate finger along the direction of extension of the gate fingers.

In some embodiments, the finger configuration of each of the first and second assemblies results in source and drain fingers being interleaved with the gate fingers.

In some embodiments, the source fingers and the drain fingers are arranged in alternating rows.

In some embodiments, the second body contact is implemented to reduce a body effect on the field-effect transistor.

In some embodiments, the second body contact is implemented to improve linearity of the field-effect transistor.

In some embodiments, the second body contact is implemented to improve breakdown behavior of the field-effect transistor.

According to some implementations, the present disclosure relates to a radio-frequency (RF) module that includes a packaging substrate configured to receive a plurality of devices and a die mounted on the packaging substrate. The die includes a field-effect transistor (FET) having an assembly of source, gate, and drain implemented on an active region. The field-effect transistor further includes a first body contact implemented at a first end of the assembly and a second body contact implemented at a second end of the assembly. The second end is distal from the first end along a width of the field-effect transistor.

In some embodiments, the radio-frequency module is a switch module.

In some embodiments, the die is a silicon-on-insulator (SOI) die.

According to some implementations, the present disclosure relates to a wireless device that includes a transceiver configured to process radio-frequency (RF) signals, a radio-frequency module in communication with the transceiver, and an antenna in communication with the radio-frequency module. The radio-frequency module includes a switching device having a field-effect transistor (FET). The field-effect transistor includes an assembly of source, gate, and drain implemented on an active region. The field-effect transistor further includes a first body contact implemented at a first end of the assembly and a second body contact implemented at a second end of the assembly. The second end is distal from the first end along a width of the field-effect transistor. The antenna is configured to facilitate transmitting and/or receiving of the radio-frequency signals.

In some embodiments, the radio-frequency module is a switch module.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

The present disclosure generally relates to switches for high-power applications such as antenna tuning, as well as low-power applications. Such switches may include field-effect transistor (FET) devices and more particularly enhancements to body contacts for such FET devices. In electronics applications, field-effect transistors (FETs) can also be utilized in amplifiers. Switches can allow, for example, routing of radio-frequency (RF) signals in wireless devices. Amplifiers can amplify signals for transmission or amplify received signals.

As an example, applications with higher voltage handling designs such as on-antenna tuning (e.g., aperture tuning), impedance matching, or higher power applications associated with base-stations, peak voltages can be as high as, for example, 100V to 200V. These applications may push the physical limitations of a switch to the point of breakdown, and the parasitic effects can become predominant, thereby limiting the maximum achievable voltage handling capability of the switching device.

Disclosed herein are various examples related to body contacts for switches, transistors or more specifically, field-effect transistors (FETs). FETs, such as those having silicon-on-insulator (SOI) process technology, are utilized in many radio-frequency (RF) circuits, including those involving high performance, low loss, high linearity switches. In such RF switching circuits, a performance advantage typically results from building a transistor in silicon, which sits on an insulator such as an insulating buried oxide (BOX). The BOX typically sits on a handle wafer, such as silicon, but can be glass, borosilicon glass, fused quartz, sapphire, silicon carbide, or any other electrically-insulating material.

In various examples herein, FETs are sometimes described in the context of such SOI technology. However, it will be understood that one or more features of the present disclosure can also be implemented in other types of FETs.

Figure 1:
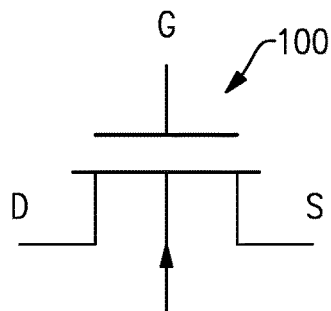
FIG. 1 illustrates a terminal representation of a FET having nodes associated with a gate, a source, a drain, and a body.

FIG. 1 illustrates a terminal representation of a FET 100 having nodes associated with a gate, a source, a drain, and a body. Examples related to contacts for such a body are described herein in greater detail.

Figure 2:
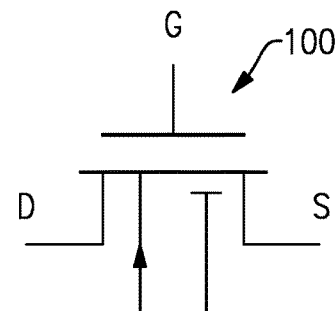
FIG. 2 illustrates a FET having a body contact configuration as well as a substrate node.

FIG. 2 illustrates that, in some embodiments, a FET 100 having a body contact configuration as described herein can also include a substrate node. Among others, U.S. Pat. Pub. No. 2016/0322385, published Nov. 3, 2016 and entitled "Substrate bias for field-effect transistor devices," which is expressly incorporated herein by reference in its entirety, discloses additional details about how such a substrate node can be biased and/or coupled to one or more other nodes of the transistor to, for example, improve both linearity and loss performance of the transistor.

U.S. Pat. Pub. No. 2016/0322385 also discloses examples of how FET devices having one or more features as described herein can be fabricated as wafers, as well as various applications that utilize such FET devices. U.S. Pat. Pub. No. 2016/0322385 also discloses examples of various products that can include such FET devices. In some embodiments, one or more of advantageous features described herein can be implemented using various techniques, such as those described in U.S. patent application Ser. No. 13/936,169, filed Jul. 6, 2013, entitled "RADIO-FREQUENCY SWITCH HAVING DYNAMIC BODY COUPLING," and U.S. patent application Ser. No. 15/475,510, filed Mar. 31, 2017, entitled "BODY CONTACTS FOR FIELD-EFFECT TRANSISTORS," each of which is incorporated herein by reference in its entirety.

Figure 3A:
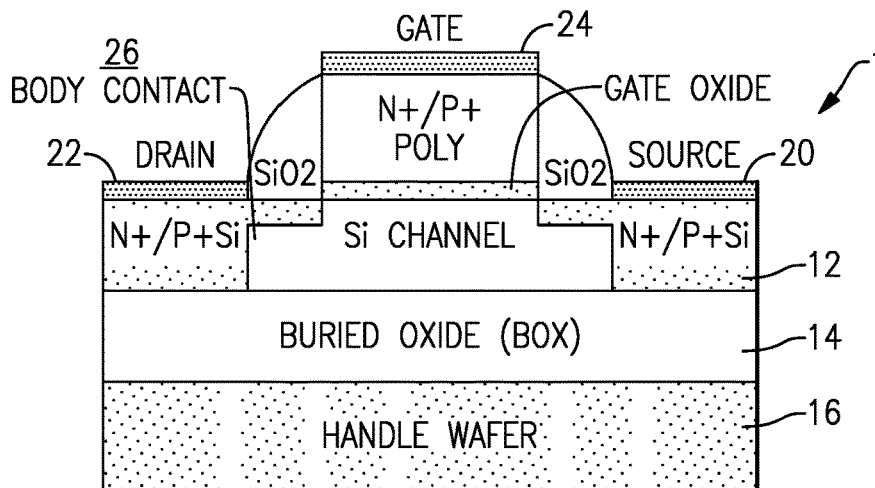
FIGS. 3A and 3B respectively illustrate side sectional and plan views of an example SOI FET device having an active FET implemented over a substrate such as a silicon substrate associated with a handle wafer.
Figure 3B:
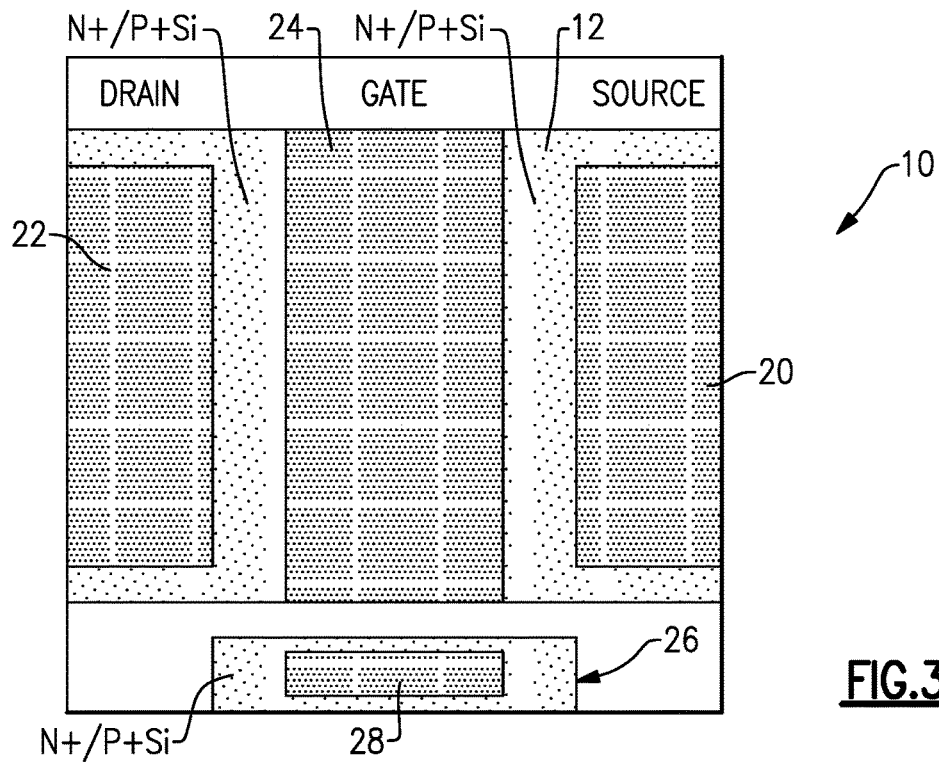

FIGS. 3A and 3B respectively illustrate side sectional and plan views of an example SOI FET device 10 having an active FET implemented over a substrate such as a silicon substrate associated with a handle wafer 16. Although described in the context of such a handle wafer, it will be understood that the substrate does not necessarily need to have functionality associated with a handle wafer.

An insulator layer such as a BOX layer 14 can be formed over the handle wafer 16, and the active FET can be formed based on an active silicon device 12 over the BOX layer 14.

In various examples described herein, and as illustrated in FIGS. 3A and 3B, the active FET can be configured as an NPN or PNP device.

In the example of FIGS. 3A and 3B, terminals for the gate 24, source 20, drain 22 and body 26 can be configured and provided to allow operation of the FET. It will be understood that in some embodiments, the source and the drain can be interchanged.

Referring to FIGS. 3A and 3B, a contact feature 28 provides an electrical contact with the body 26. It is noted that in the example of FIGS. 3A and 3B, such a body contact feature 28 is located at one end of the FET device 10.

In general, a body contact is typically utilized to control a voltage potential associated with the FET body. If the body contact is implemented at an end of a given FET device, such as in the example of FIGS. 3A and 3B, such voltage controlling influence provided by the body contact may weaken significantly at locations relatively far away from the body contact.

Figure 4:
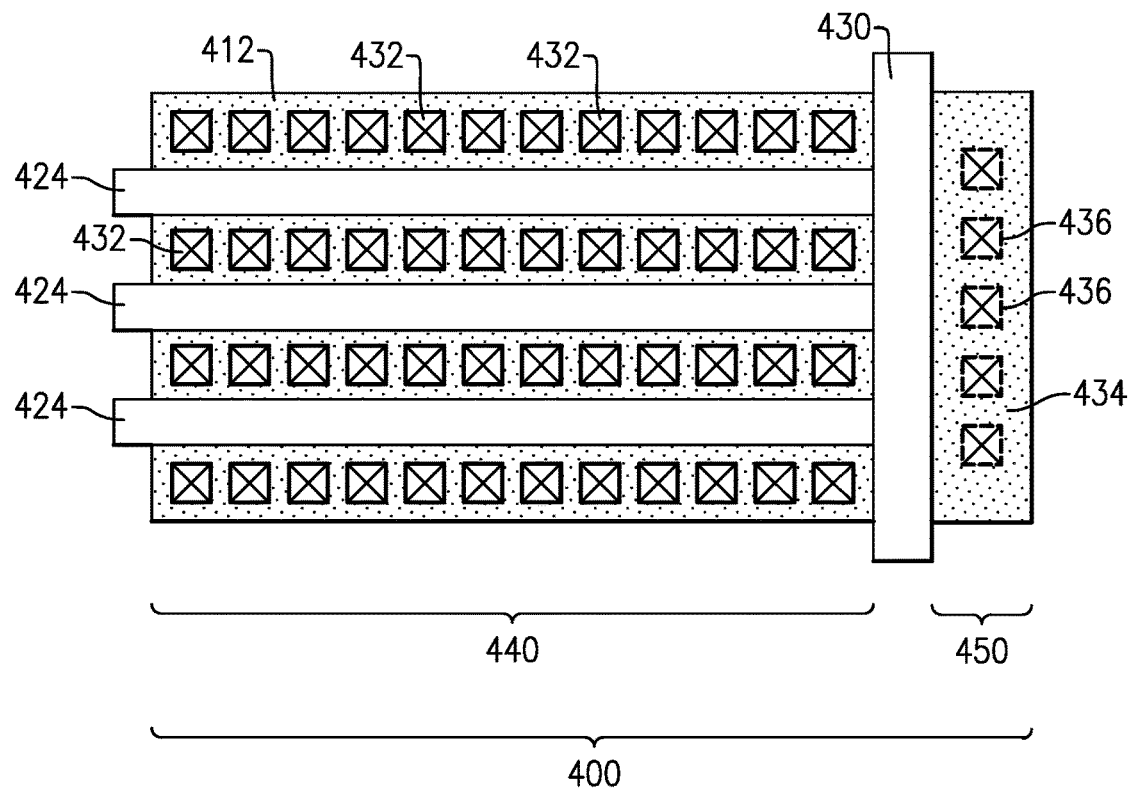
FIG. 4 illustrates an example of a FET device having a T-shaped body contact configuration.

For example, FIG. 4 illustrates an example of a FET device 400 having a T-shaped body contact configuration. More particularly, a plurality of conductive features 436 such as conductive vias can be implemented on a region of a body 434 to generally form a body contact 450. In the example of FIG. 4, such a body contact 450 generally forms a "T" shape along with the direction of a plurality of gate fingers 424.

In the example of FIG. 4, the gate fingers 424 and a connecting metal 430 can collectively form a gate contact for the FET device 400. Portions of an active region 412 between the gate fingers 424 can be provided with a plurality of conductive features 432 such as conductive vias to form alternating strips of source and drain for the FET device 400.

In the example of FIG. 4, the foregoing configuration generally results in an assembly of source, gate and drain generally occupying a region indicated as 440, and the body contact occupying a region indicated as 450. To facilitate the description herein, the region 440 may be referred to as an assembly of source, gate and drain, or simply as S/G/D, an S/G/D region, or an S/G/D assembly. Similarly, the region 450 may be referred to herein as a body contact, a body, or the like.

Figure 5:
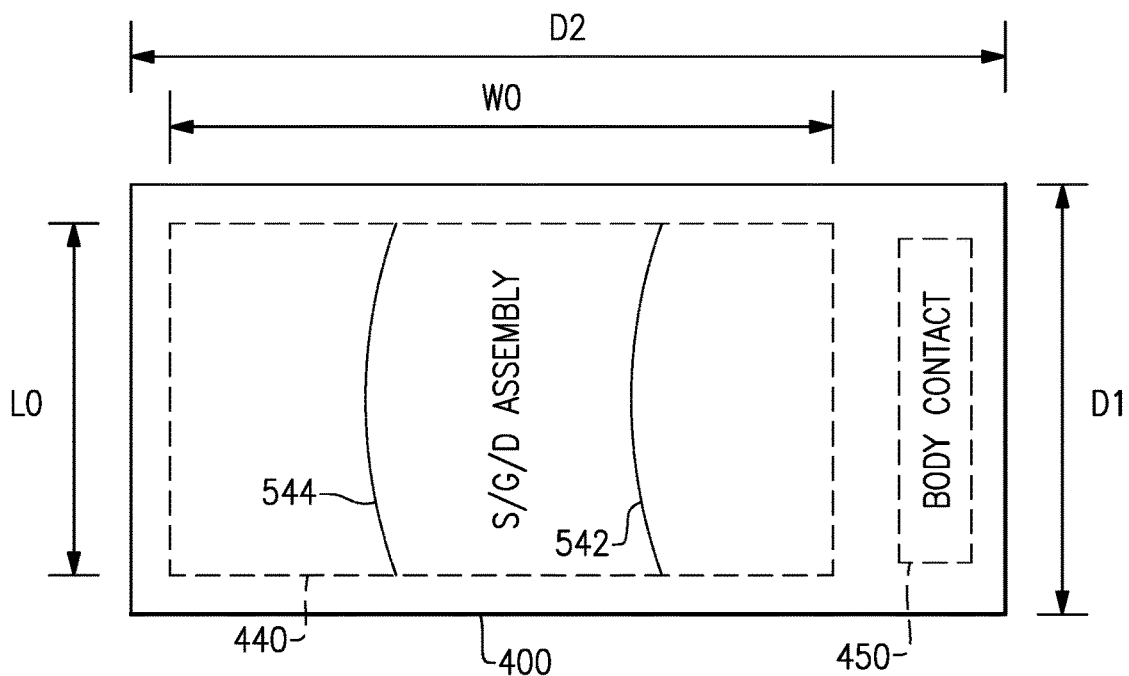
FIG. 5 illustrates a block diagram of the example FET device of FIG. 4.

FIG. 5 illustrates a block diagram of the example FET device 400 of FIG. 4. Such a FET device can have an overall dimension of D1×D2. The S/G/D region 440 has a width of W0, and a length of L0. The body contact 450 can be positioned on one end of the width (W0) dimension.

Depicted in the S/G/D region 440 are examples of influence contour lines 542, 544 that can result from, for example, application of a voltage at the body contact 450. Generally, such an influence from the body contact 450 decreases as distance increases. Accordingly, the body contact influence in a first example region between the body contact 450 and the first influence contour line 542 is generally stronger than the body contact influence in a second example region between the first influence contour line 542 and the second influence contour line 544. Similarly, the body contact influence beyond the second influence contour line 544 is generally weaker than the body contact influence in the second region. Accordingly, a relatively weak control of the body can result in FET devices such as that of FIGS. 4 and 5. For example, the region to the left of the second influence contour line 544 (when viewed as depicted in FIG. 5) can have a relatively weak body control when compared to the region to the right of the first influence contour line 542.

Figure 6:
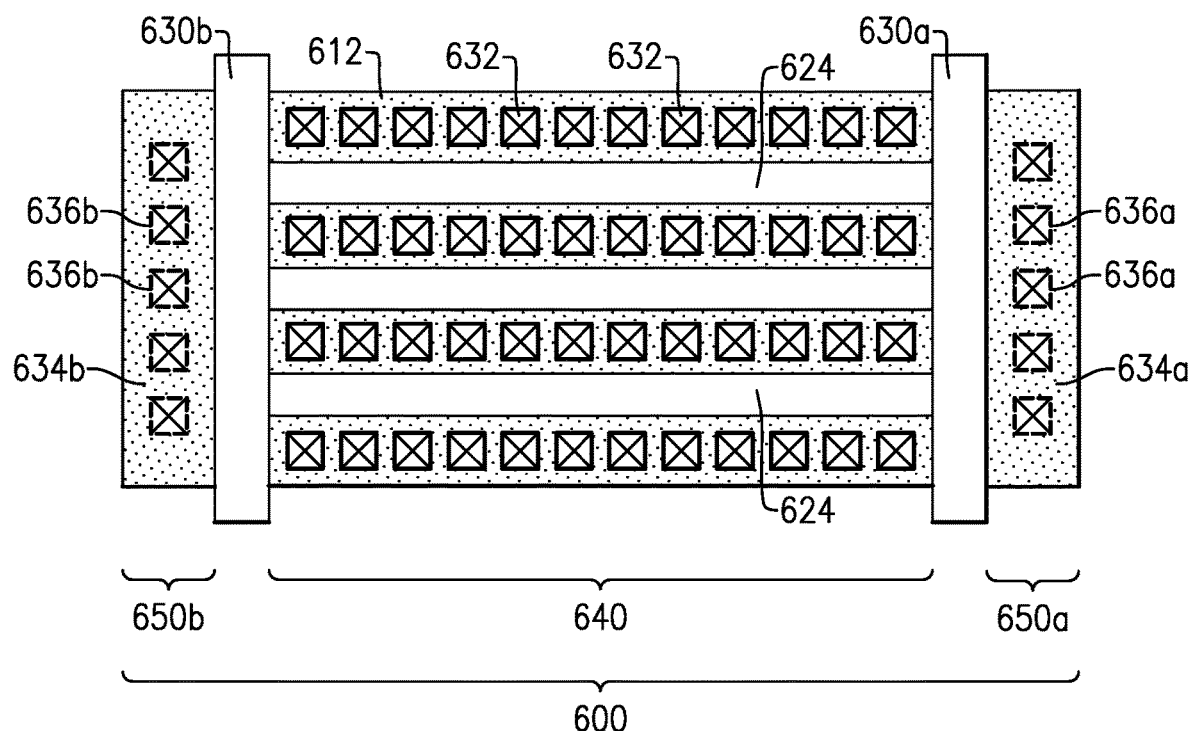
FIGS. 6 and 7 illustrate another example FET device having a configuration similar to the example FET device of FIGS. 4 and 5, but with an additional body contact implemented on the opposite end of an S/G/D region.
Figure 7:
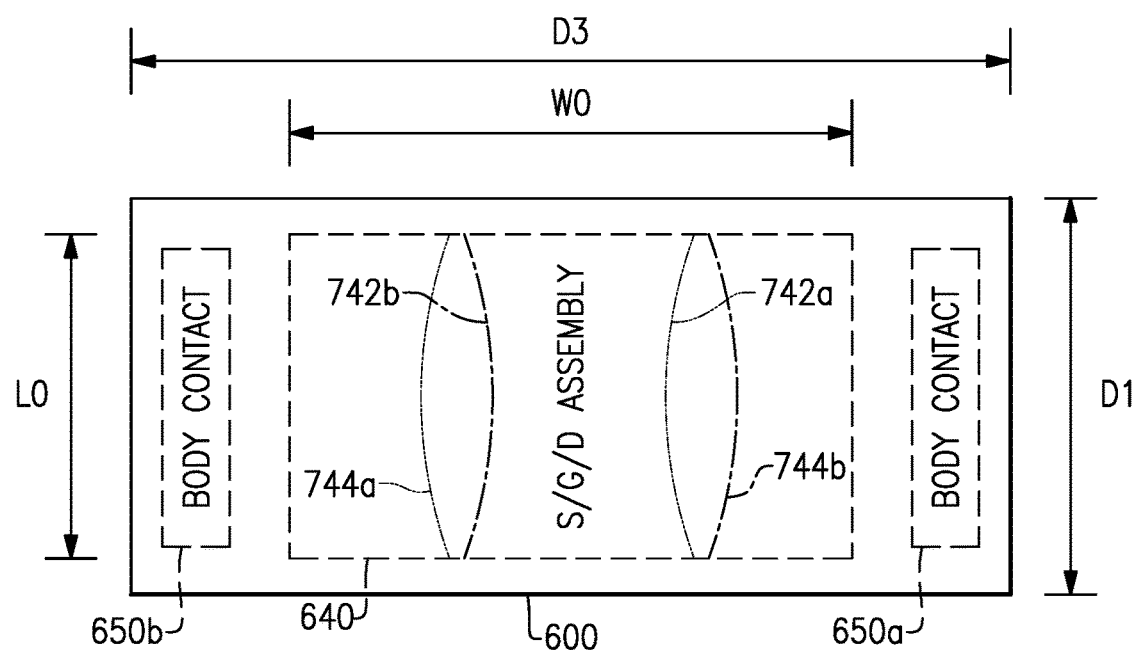

FIGS. 6 and 7 illustrate another example FET device 600 having a configuration similar to the example FET device 400 of FIGS. 4 and 5, but with an additional body contact implemented on the opposite end of an S/G/D region 640. More particularly, the S/G/D region 640 can include a plurality of gate fingers 624, and strips of source and drain about such gate fingers. The gate fingers 624 can be connected by first and second connecting metals 630a, 630b to form a gate contact for the FET device 600.

A first body contact 650a can be implemented on the first end of the FET device 600 (e.g., the right side in the example FET device 600). Similarly, a second body contact 650b can be implemented on the second end of the FET device 600. Accordingly, the two body contacts 650a, 650b and the direction of the gate fingers 624 generally form an "H" shape.

To merely facilitate the description of the FET device 600, suppose that the S/G/D region 640 is dimensioned (L0×W0) similar to the example of FIGS. 4 and 5. In such a configuration, the first body contact 650a can exert its influence as depicted by first and second influence contour lines 742a, 744a. Similarly, the second body contact 650b can exert its influence as depicted by first and second influence contour lines 742b, 744b.

Accordingly, the weak body contact influence region (e.g., on the left side) in the example of FIGS. 4 and 5 is now strongly influenced by the second body contact 650b. Such a dual body contact configuration involves addition of the second body contact. Still assuming the same S/G/D region dimensions (L0×W0) among the examples of FIGS. 4 and 5 and FIGS. 6 and 7, such a second body contact may increase the overall dimensions of the FET device 600. For example, the D2 dimension of the example FET device of FIGS. 4 and 5 is increased to a dimension of D3. However, this small increase in the size of the FET device 600 may be relatively negligible compared to other circuit implementations to address the problems associated with regions of the S/G/D region 640 having weak body control, as in FIGS. 4 and 5. For example, this additional body contact may reduce the need for additional components electrically connected to the body of the FET device 600, to compensate for the weak body control. Therefore, the addition of the second body contact provides an efficient source of improving the performance and life of the FET device. The configuration shown in FIGS. 6 and 7 may provide additional advantageous features described herein.

Figure 8:
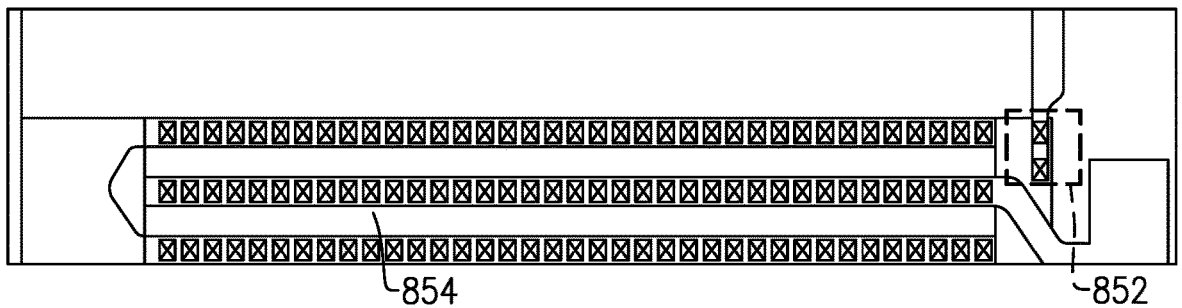
FIG. 8 illustrates a physical layout representation of a radio-frequency switching device with one body contact at a first end of the switching device.

FIG. 8 illustrates a physical layout representation of a radio-frequency switching device 850 (e.g., a FET) with one body contact 852 at a first end of the switching device. In some embodiments the RF switching device includes more than one switch or more than one transistor (e.g., FET). While enhancements to the RF switching device 850 will be discussed with respect to a single FET throughout this disclosure, one of ordinary skill in the art will appreciate that more than one FET may be implemented in an RF switching device as described herein.

The FET device shown in RF switching device 850 only includes one body contact 852, tied to a first end of the active silicon device 854 of the FET. This is typical practice in the physical design of a FET, however the size of the body contact 852 may vary. In some embodiments, a body contact 852 includes one or more vias, as shown. The one or more vias may provide an electrical connection for the body contact 852 from the active silicon device 854 up to one or more metal layers.

Figure 9:
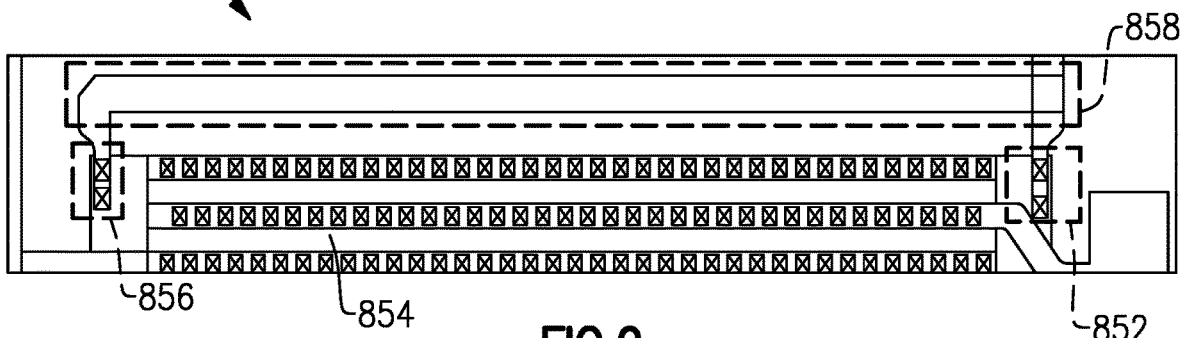
FIG. 9 illustrates a physical layout representation of another radio-frequency switching device with two body contacts at two ends of the switching device.

FIG. 9 illustrates a physical layout representation of another radio-frequency switching device 860 with two body contacts 852 and 856 at two ends of the switching device 860. The FET device shown in RF switching device 860 includes a second body contact 856 tied to a second end of the active silicon device 854 of the FET. As shown in FIG. 9, in some embodiments, one or more body contacts of a transistor of the RF switching device 860, may be connected to each other by a connection element 858. In some embodiments, connection element 858 is a metal trace (e.g., in the first metal layer above polysilicon). In some embodiments, the connection element 858 is a reinforced connection with a width greater than a minimum-width trace for the respective layer in which it is implemented.

FIG. 9 illustrates that the addition of the second body contact 856, is implemented at a distal end to the placement of the first body contact 852. In some implementations, and as described herein, the active silicon device of the FET shown in RF switching device 860 is substantially rectangular in shape. The longer dimension of the FET may be considered the width of the device and the shorter dimension may be considered the length of the device. In some embodiments, the placement of one or more body contact devices is implemented in a FET to be substantially symmetrical along the width of the device, as shown in FIG. 9. For example, first body contact 852 is at one end of the width dimension, and second body contact 856 is at a second end of the width dimension, such that each is located equidistant from a point in the middle of the width of the FET. In some embodiments, the body contacts are symmetrical with respect to more than one dimension. For example, if first body contact 852 extended down to the entire length of the FET, and second body contact 856 also extended down to the entire length of the FET, the two body contacts would be symmetrical with respect to the length and width dimensions of the FET.

In some embodiments, the placement of two or more body contacts is not symmetrical, but is distributed along one dimension of the active silicon device (e.g., the width), according to the direction of the flow of current in the FET (e.g., to a substrate/body contact). For example, as shown in FIG. 9, second body contact 856 was placed at the opposite end of the width of the active silicon device of the FET (e.g., on the left side of the device as shown), rather than on the same end of the width of the active silicon device but at the other end of the length of the FET (e.g., on the right side of the device as shown).

As described above with respect to FIGS. 4-7, implementing additional body contacts provide greater performance enhancement of the RF switching device 860, if distributed apart from each other in the direction of current flow in fingers of a transistor of the RF switching device 860. This provides additional "boot-strapping" of the body (e.g., bulk or substrate) of the FET to its contact (e.g., to the lowest or highest voltage in the circuit), to reduce a body effect on the FET. A body effect reduces the ability of the FET to exhibit controlled behavior under normal operating conditions. Forming an additional body contact as shown in FIG. 9 reduces the likelihood of forward-biasing the source-body junction and causing breakdown of the FET at a lower input power. Additional improvements in performance can include, but are not limited to, device insertion loss, isolation performance, power handling capability and/or switching device linearity.

Examples of Switching Performance Parameters

Insertion Loss

A switching device performance parameter can include a measure of insertion loss. A switching device insertion loss can be a measure of the attenuation of an RF signal that is routed through the RF switching device. For example, the magnitude of an RF signal at an output port of a switching device can be less than the magnitude of the RF signal at an input port of the switching device. In some embodiments, a switching device can include device components that introduce parasitic capacitance, inductance, resistance, or conductance into the device, contributing to increased switching device insertion loss. In some embodiments, a switching device insertion loss can be measured as a ratio of the power or voltage of an RF signal at an input port to the power or voltage of the RF signal at an output port of the switching device. Decreased switching device insertion loss can be desirable to enable improved RF signal transmission.

Isolation

A switching device performance parameter can also include a measure of isolation. Switching device isolation can be a measure of the RF isolation between an input port and an output port an RF switching device. In some embodiments, it can be a measure of the RF isolation of a switching device while the switching device is in a state where an input port and an output port are electrically isolated, for example while the switching device is in an OFF state. Increased switching device isolation can improve RF signal integrity. In certain embodiments, an increase in isolation can improve wireless communication device performance.

Intermodulation Distortion

A switching device performance parameter can further include a measure of intermodulation distortion (IMD) performance. Intermodulation distortion (IMD) can be a measure of non-linearity in an RF switching device.

IMD can result from two or more signals mixing together and yielding frequencies that are not harmonic frequencies. For example, suppose that two signals have fundamental frequencies $f_1$ and $f_2$ ($f_2 > f_1$) that are relatively close to each other in frequency space. Mixing of such signals can result in peaks in frequency spectrum at frequencies corresponding to different products of fundamental and harmonic frequencies of the two signals. For example, a second-order intermodulation distortion (also referred to as IMD2) is typically considered to include frequencies $f_1 + f_2$, $f_2 - f_1$, $2f_1$, and $2f_2$. A third-order IMD (also referred to as IMD3) is typically considered to include $2f_1 + f_2$, $2f_1 - f_2$, $f_1 + 2f_2$, $f_1 - 2f_2$. Higher order products can be formed in similar manners.

In general, as the IMD order number increases, power levels decrease. Accordingly, second and third orders can be undesirable effects that are of particular interest. Higher orders such as fourth and fifth orders can also be of interest in some situations.

In some RF applications, it can be desirable to reduce susceptibility to interference within an RF system. Non linearity in RF systems can result in introduction of spurious signals into the system. Spurious signals in the RF system can result in interference within the system and degrade the information transmitted by RF signals. An RF system having increased non-linearity can demonstrate increased susceptibility to interference. Non-linearity in system components, for example switching devices, can contribute to the introduction of spurious signals into the RF system, thereby contributing to degradation of overall RF system linearity and IMD performance.

In some embodiments, RF switching devices can be implemented as part of an RF system including a wireless communication system. IMD performance of the system can be improved by increasing linearity of system components, such as linearity of an RF switching device. In some embodiments, a wireless communication system can operate in a multi-band and/or multi-mode environment. Improvement in intermodulation distortion (IMD) performance can be desirable in wireless communication systems operating in a multi-band and/or multi-mode environment. In some embodiments, improvement of a switching device IMD performance can improve the IMD performance of a wireless communication system operating in a multi-mode and/or multi-band environment.

Improved switching device IMD performance can be desirable for wireless communication devices operating in various wireless communication standards, for example for wireless communication devices operating in the LTE communication standard. In some RF applications, it can be desirable to improve linearity of switching devices operating in wireless communication devices that enable simultaneous transmission of data and voice communication. For example, improved IMD performance in switching devices can be desirable for wireless communication devices operating in the LTE communication standard and performing simultaneous transmission of voice and data communication (e.g., SVLTE).

High Power Handling Capability

In some RF applications, it can be desirable for RF switching devices to operate under high power while reducing degradation of other device performance parameters. In some embodiments, it can be desirable for RF switching devices to operate under high power with improved intermodulation distortion, insertion loss, and/or isolation performance.

In some embodiments, an increased number of transistors can be implemented in a switch arm segment of a switching device to enable improved power handling capability of the switching device. For example, a switch arm segment can include an increased number of FETs connected in series, an increased FET stack height, to enable improved device performance under high power. However, in some embodiments, increased FET stack height can degrade the switching device insertion loss performance.

Figure 10:
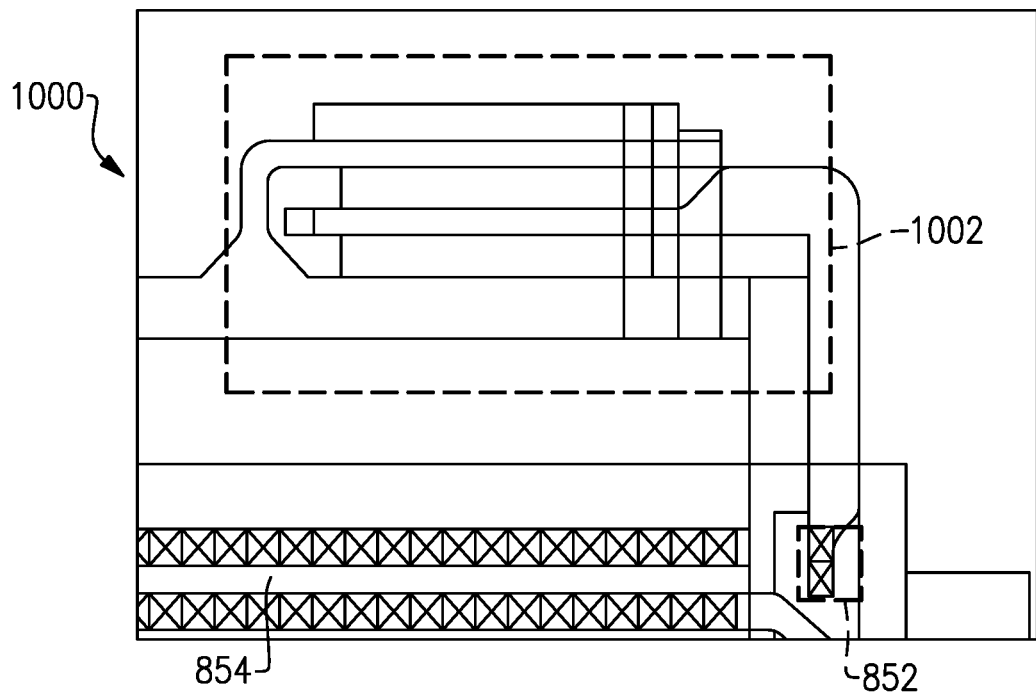
FIG. 10 illustrates a physical layout representation of another radio-frequency switching device.

FIG. 10 illustrates a physical layout representation of another radio-frequency switching device 1000. As illustrated in FIG. 10, in some implementations, a body contact 852 of a FET may be electrically connected to a PMOS FET 1002, implemented as a diode. In some implementations the PMOS FET 1002 is also electrically connected to a gate terminal of the FET to which body contact 852 is electrically connected. In some embodiments, FIG. 10 represents a "traditional" layout or design implementation, where a single body contact 852 of a FET is electrically connected to a PMOS FET 1002, one or more registers and/or one or more resistors.

Figure 11:
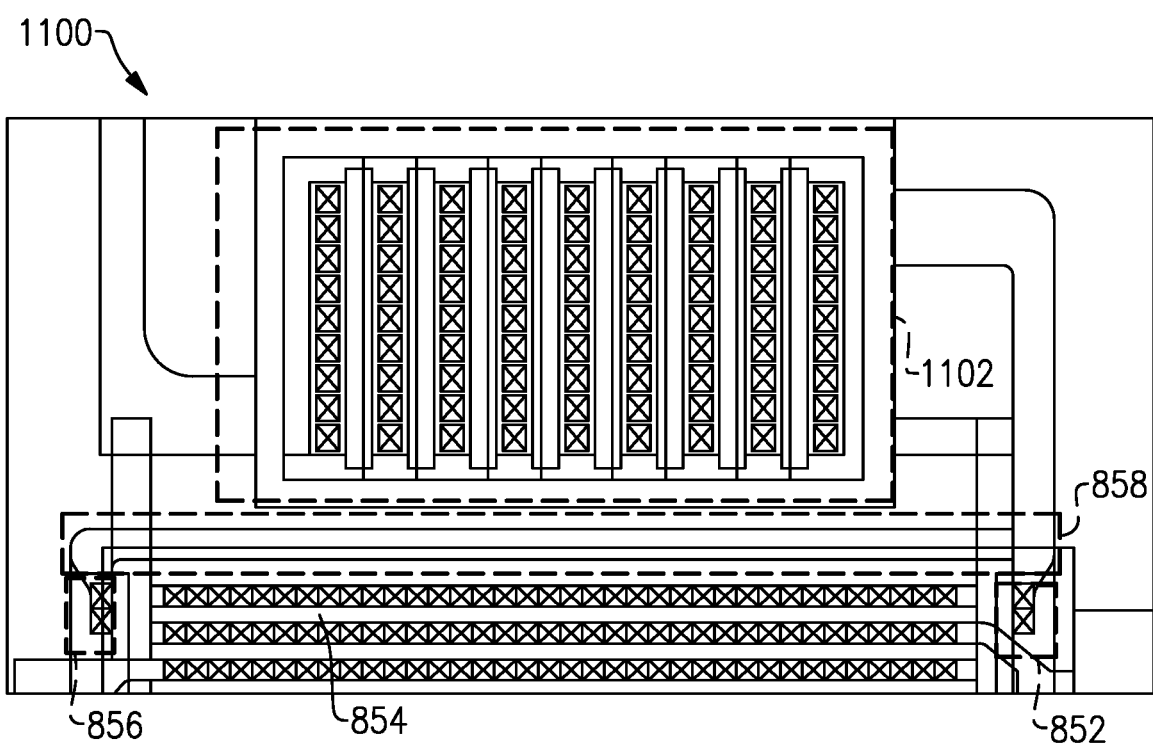
FIG. 11 illustrates a physical layout representation of another radio-frequency switching device.

FIG. 11 illustrates a physical layout representation of another radio-frequency switching device 1100. As illustrated in FIG. 11, in some implementations, one or more body contacts, such as body contacts 852 and 856 are electrically connected to a P-N junction diode 1102 instead of the PMOS FET 1002 of FIG. 10. In some implementations, the P-N junction diode 1102 must be implemented in conjunction with the added body contacts (e.g., at least second body contact 856), as described in implementation above with respect to FIGS. 6, 7, and 9.

Figure 12A:
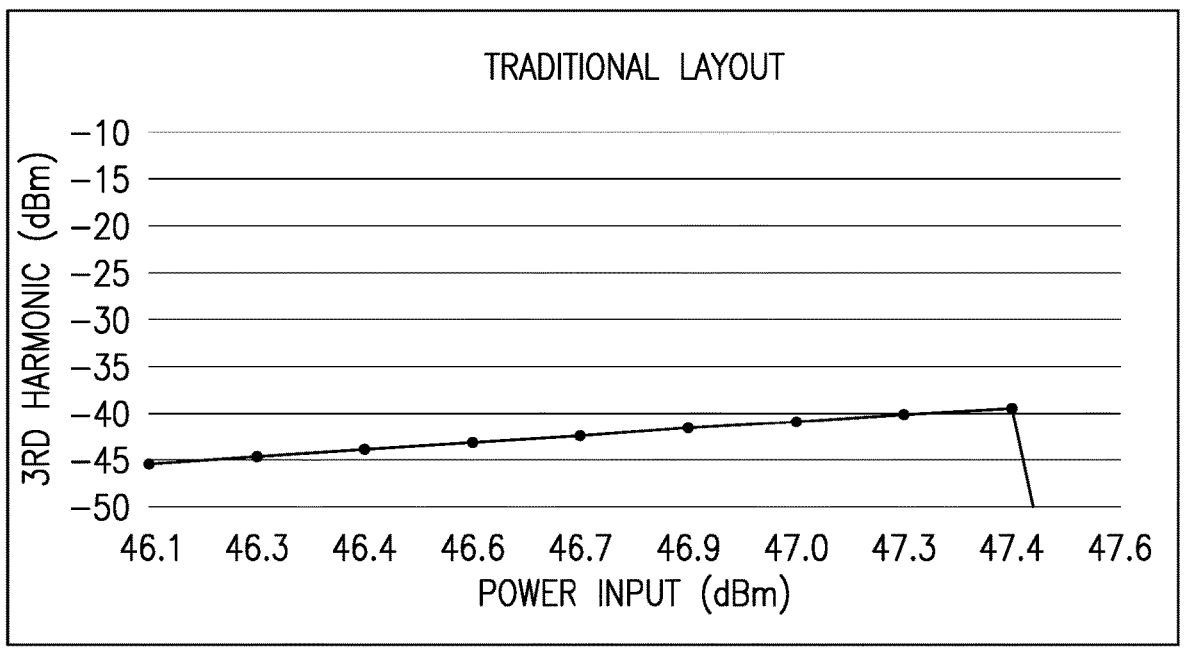
FIG. 12A illustrates a graphical representation of a $3^{rd}$ harmonic measurement compared to input power of a FET implemented with a layout as described with respect to FIG. 10.

FIG. 12A illustrates a graphical representation of a $3^{rd}$ harmonic measurement (e.g., 3fo or $3^{rd}$ fundamental oscillator frequency) compared to input power of a FET implemented with a layout as described above with respect to FIG. 10. This FET has a single body contact, which is electrically connected to a PMOS FET acting as a diode. As can be seen in the example behavior of the FET represented in FIG. 12A, a steady, linear increase in the $3^{rd}$ harmonic power measurement is observed as the input power increases, until a sharp drop-off occurs (e.g., at 47.4 dBm). This sharp drop-off may be considered the point at which a hard breakdown of the transistor occurs. A hard breakdown may be considered an undesirable performance trait of a transistor, because it represents an abrupt failure of the switch without warning. Additionally, an industry threshold for an accepted 3fo measurement may be −36 dBm, which is not met by the performance of this FET represented in FIG. 12A, as it experiences a hard breakdown before the input power can get high enough to hit that level.

Figure 12B:
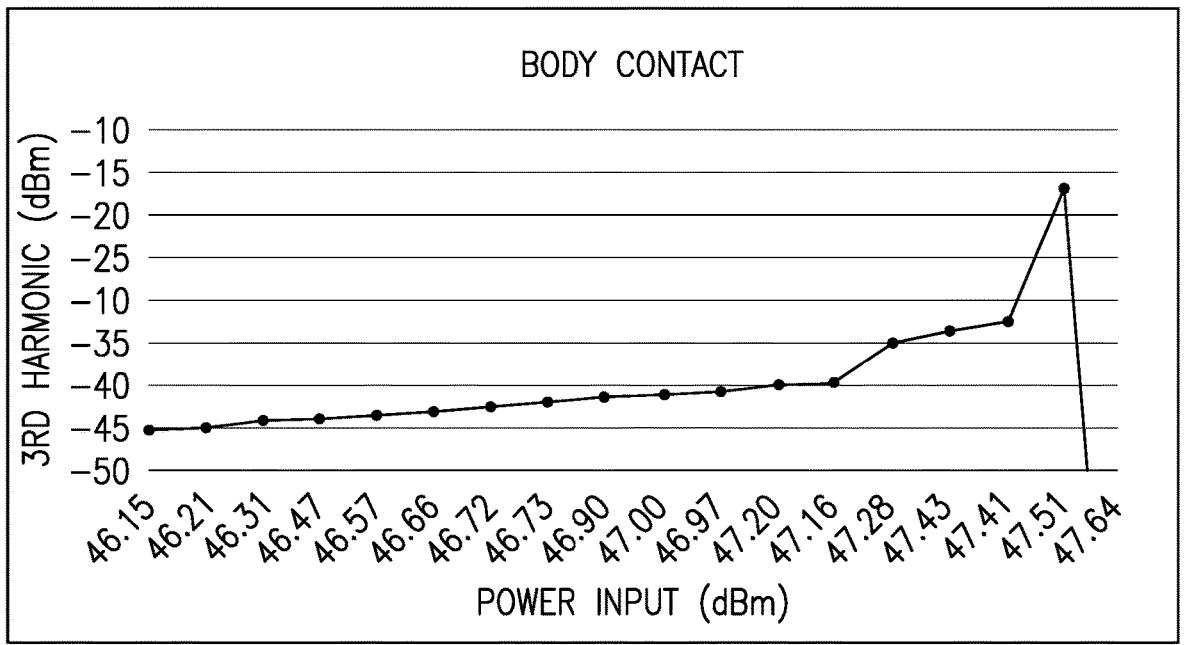
FIG. 12B illustrates a graphical representation of a $3^{rd}$ harmonic measurement compared to input power of a FET implemented with a layout such as described with respect to FIG. 9.

FIG. 12B illustrates a graphical representation of a $3^{rd}$ harmonic measurement compared to input power of a FET implemented with a layout such as described above with respect to FIG. 9. This FET has two body contacts, one implemented at each end of the width of the FET. This FET is otherwise the same in structure as the one represented in FIG. 12A, including having the body contacts electrically connected to a PMOS FET acting as a diode.

As can be seen in FIG. 12B, the behavior of this FET is similar to that of the FET represented by the graph in FIG. 12A, at lower input power levels. A steady, linear increase in the $3^{rd}$ harmonic power measurement is observed up to approximately 47.17 dBm. From this point up to approximately 47.51 dBm, a non-linear relationship between the $3^{rd}$ harmonic power measurement and the input power is observed, before hard breakdown of the transistor at approximately 47.51 dBm of input power applied. In this example, a region of soft breakdown is observed before the transistor experiences hard breakdown. In the example shown in FIG. 12B, the range of input voltage exhibiting soft breakdown is approximately 47.16 dBm to 47.5 dBm. In this range of input power, an unexpected change in the rate of increase of the measured $3^{rd}$ harmonic power (e.g., as observed between 47.16 dBm and 47.28 dBm) can provide a warning of impending transistor breakdown. It may then be possible to save the transistor from complete device failure by reducing or maintaining the input power applied to the transistor.

Additionally, as can be seen in FIG. 12B, an example industry threshold of −36 dBm can be met (e.g., at an approximate input power of 47.28 dBm), before the transistor experiences hard breakdown. Therefore this device would likely avoid experiencing a hard breakdown by the additional requirement of staying below that industry-mandated threshold.

Figure 13A:
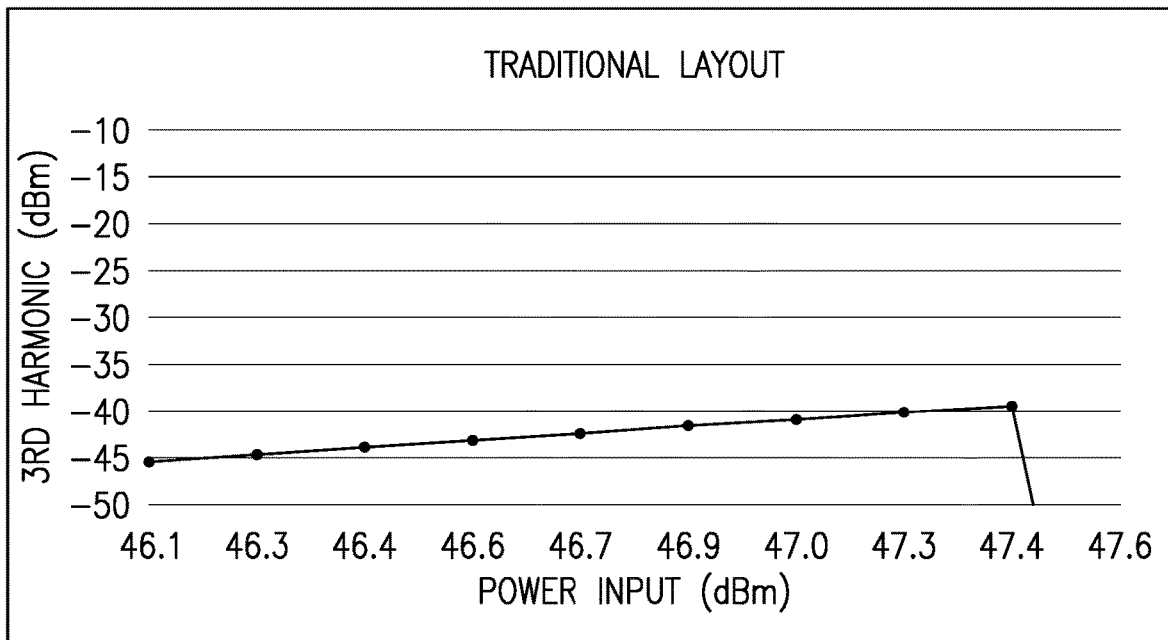
FIG. 13A illustrates the same graphical representation shown and described with respect to FIG. 12A.
Figure 13B:
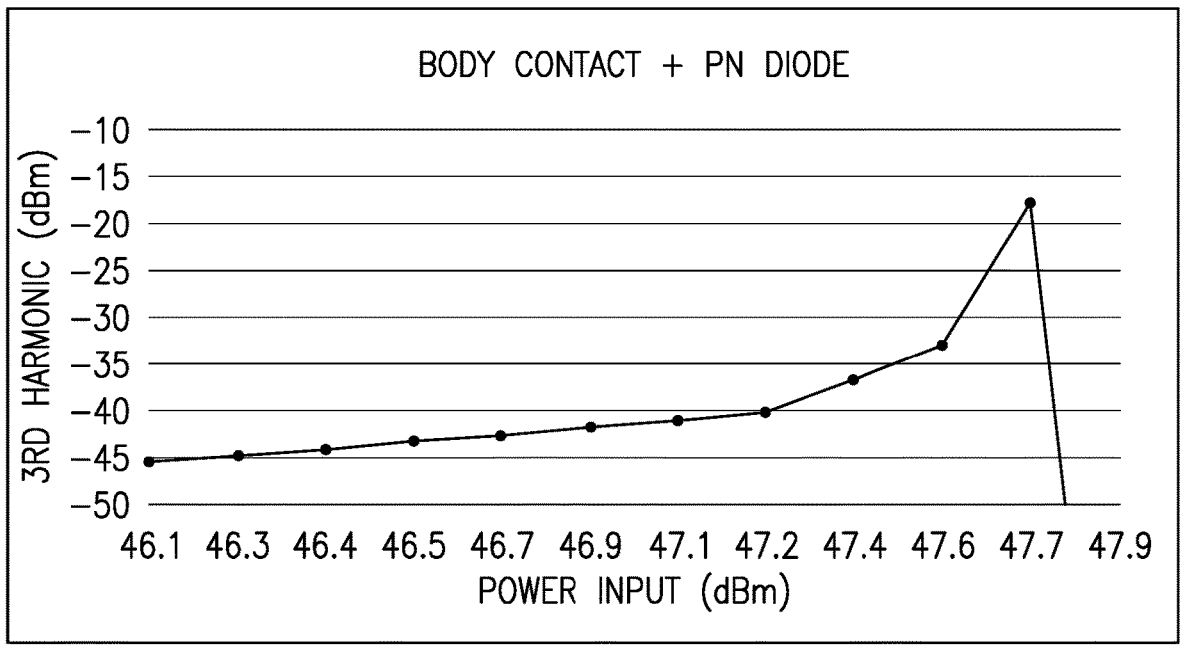
FIG. 13B illustrates a further improvement in device behavior when implementing a FET as described and shown with respect to FIG. 11.

FIG. 13A illustrates the same graphical representation shown and described above with respect to FIG. 12A. FIG. 13B illustrates a further improvement in device behavior when implementing a FET as described and shown above with respect to FIG. 11. In FIG. 11, a P-N junction diode is electrically connected to two body contacts of the FET represented by the graph in FIG. 13B. In this graph, a soft breakdown region may be considered to exist in approximately 47.22 dBm to 47.704 dBm. This provides almost 0.5 dBm of input power increase from the onset of soft breakdown, before experiencing hard breakdown at approximately 47.704 dBm. In the example described with respect to FIG. 12B, the soft breakdown was observed over a smaller range of input power, closer to 0.12 dBm. Additionally, the example industry threshold of −36 dBm of $3^{rd}$ harmonic power is reached when the input power is approximately 47.42 dBm. As a result, the combination of the extra body contact and implementation of a P-N junction diode electrically connected to the body of the FET provides the best electrical response of the three presented implementations.

Examples of FET Structures and Fabrication Process Technologies

A switching device can be implemented on-die, off-die, or some combination thereon. A switching device can also be fabricated using various technologies. In some embodiments, RF switching devices can be fabricated with silicon or silicon-on-insulator (SOI) technology.

As described herein, an RF switching device can be implemented using silicon-on-insulator (SOI) technology. In some embodiments, SOI technology can include a semiconductor substrate having an embedded layer of electrically insulating material, such as a buried oxide layer beneath a silicon device layer. For example, an SOI substrate can include an oxide layer embedded below a silicon layer. Other insulating materials known in the art can also be used.

Implementation of RF applications, such as an RF switching device, using SOI technology can improve switching device performance. In some embodiments, SOI technology can enable reduced power consumption. Reduced power consumption can be desirable in RF applications, including those associated with wireless communication devices. SOI technology can enable reduced power consumption of device circuitry due to decreased parasitic capacitance of transistors and interconnect metallization to a silicon substrate. Presence of a buried oxide layer can also reduce junction capacitance or use of high resistivity substrate, enabling reduced substrate related RF losses. Electrically isolated SOI transistors can facilitate stacking, contributing to decreased chip size.

Figure 14A:
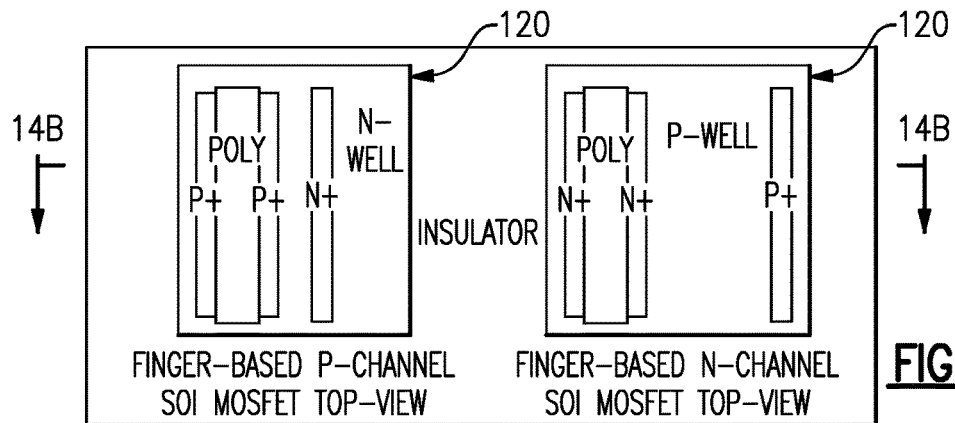
FIGS. 14A and 14B show plan and side sectional views of an example finger-based FET device implemented on SOI.
Figure 14B:
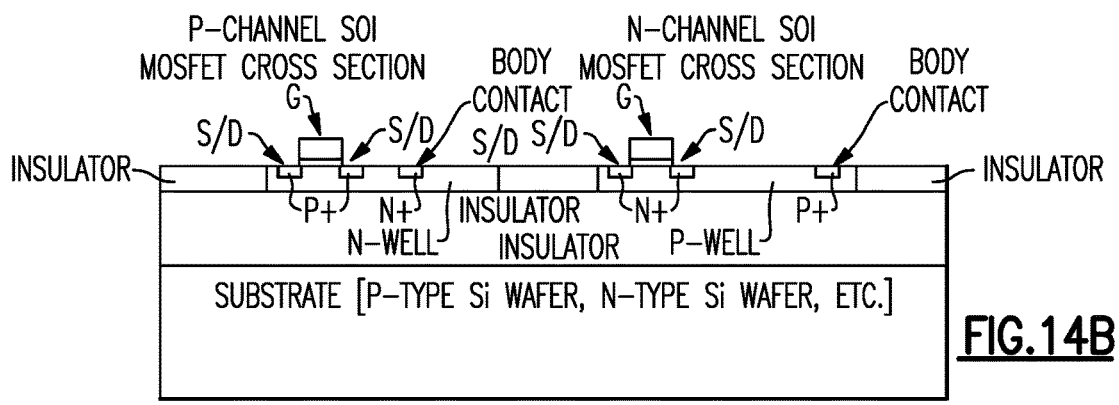

In some SOI FET configurations, each transistor can be configured as a finger-based device where the source and drain are rectangular shaped (in a plan view) and a gate structure extends between the source and drain like a rectangular shaped finger. FIGS. 14A and 14B show plan and side sectional views of an example finger-based FET device implemented on SOI. As shown, FET devices described herein can include a p-type FET or an n-type FET. Thus, although some FET devices are described herein as p-type devices, it will be understood that various concepts associated with such p-type devices can also apply to n-type devices.

As shown in FIGS. 14A and 14B, a pMOSFET can include an insulator layer formed on a semiconductor substrate. The insulator layer can be formed from materials such as silicon dioxide or sapphire. An n-well is shown to be formed in the insulator such that the exposed surface generally defines a rectangular region. Source(S) and drain (D) are shown to be p-doped regions whose exposed surfaces generally define rectangles. As shown, S/D regions can be configured so that source and drain functionalities are reversed.

FIGS. 14A and 14B further show that a gate (G) can be formed on the n-well so as to be positioned between the source and the drain. The example gate is depicted as having a rectangular shape that extends along with the source and the drain. Also shown is an n-type body contact. Formations of the rectangular shaped well, source and drain regions, and the body contact can be achieved by a number of known techniques. In some embodiments, the source and drain regions can be formed adjacent to the ends of their respective upper insulator layers, and the junctions between the body and the source/drain regions on the opposing sides of the body can extend substantially all the way down to the top of the buried insulator layer. Such a configuration can provide, for example, reduced source/drain junction capacitance. To form a body contact for such a configuration, an additional gate region can be provided on the side so as to allow, for example, an isolated P+ region to contact the Pwell.

Figure 15A:
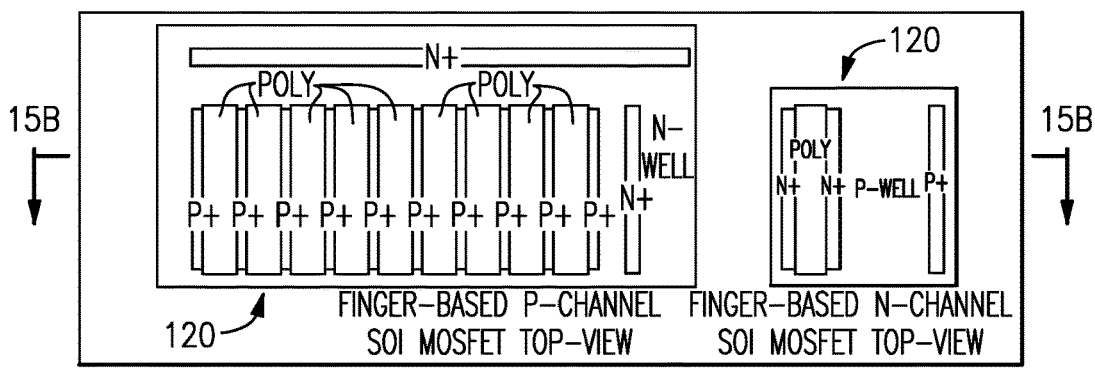
FIGS. 15A and 15B show plan and side sectional views of an example of a multiple-finger FET device implemented on SOI.
Figure 15B:
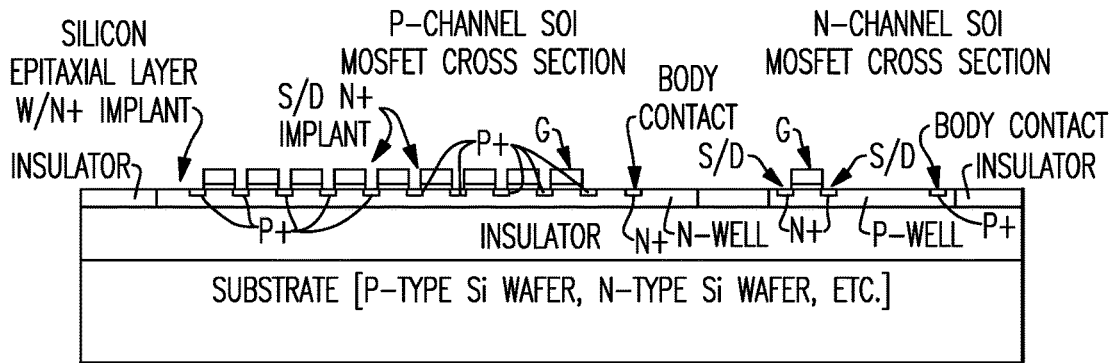

FIGS. 15A and 15B show plan and side sectional views of an example of a multiple-finger FET device implemented on SOI. Formations of rectangular shaped n-well, rectangular shaped p-doped regions, rectangular shaped gates, and n-type body contact can be achieved in manners similar to those described in reference to FIGS. 14A and 14B.

The example multiple-finger FET device of FIGS. 15A and 15B can be made to operate such that a drain of one FET acts as a source of its neighboring FET. Thus, the multiple-finger FET device as a whole can provide a voltage-dividing functionality. For example, an RF signal can be provided at one of the outermost p-doped regions (e.g., the leftmost p-doped region); and as the signal passes through the series of FETs, the signal's voltage can be divided among the FETs. In such an example, the rightmost p-doped region can act as an overall drain of the multi-finger FET device.

In some implementations, a plurality of the foregoing multi-finger FET devices can be connected in series as a switch to, for example, further facilitate the voltage-dividing functionality. A number of such multi-finger FET devices can be selected based on, for example, power handling requirement of the switch.

Packaged Module Implementation

Figure 16:
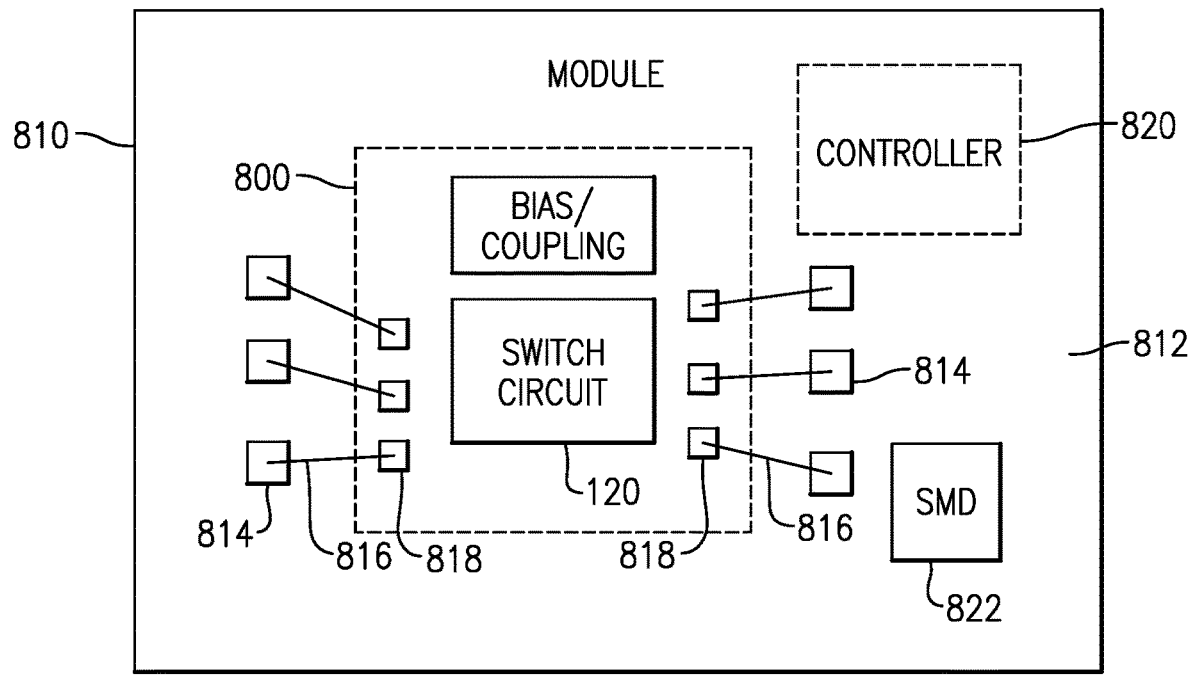
FIGS. 16 and 17 show plan and side views of an example module in which one or more die having one or more features described herein can be implemented.

In some embodiments, one or more die having one or more features described herein can be implemented in a packaged module. An example of such a module is shown in FIGS. 16 (plan view) and 17 (side view). Although described in the context of both of the switch circuit and the bias/coupling circuit being on the same die, it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 120 and a bias/coupling circuit 150 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 17:
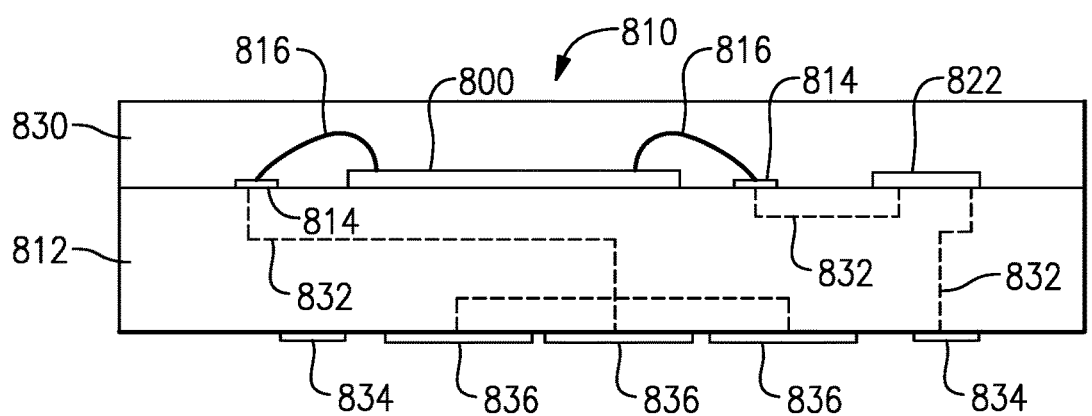
Figure 18:
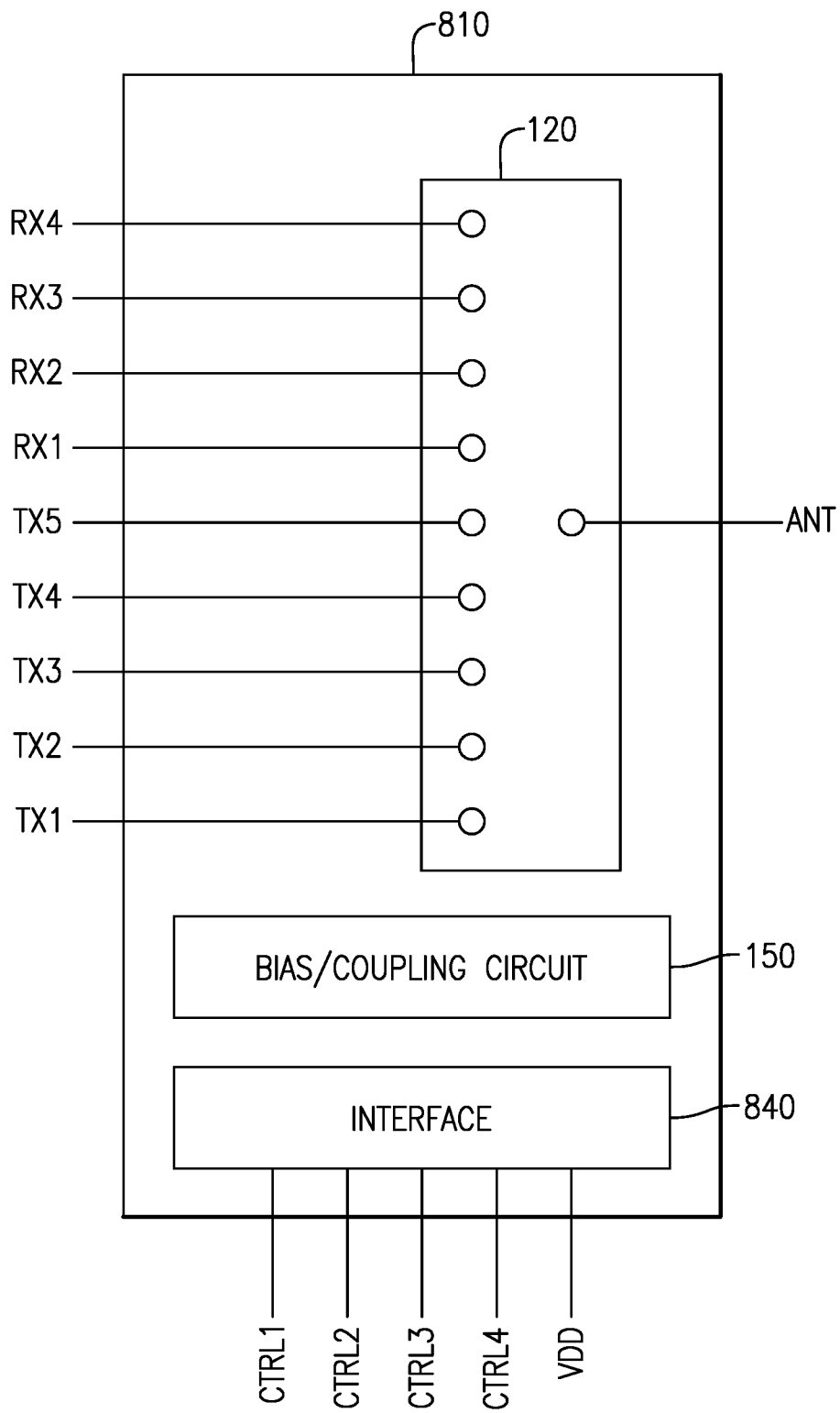
FIG. 18 shows a schematic diagram of an example switching configuration that can be implemented in the module described with respect to FIGS. 16 and 17.

FIG. 18 shows a schematic diagram of an example switching configuration that can be implemented in the module 810 described in reference to FIGS. 16 and 17. In the example, the switch circuit 120 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 120 and/or the bias/coupling circuit 150. In some implementations, supply voltage and control signals can be applied to the switch circuit 120 via the bias/coupling circuit 150.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 19:
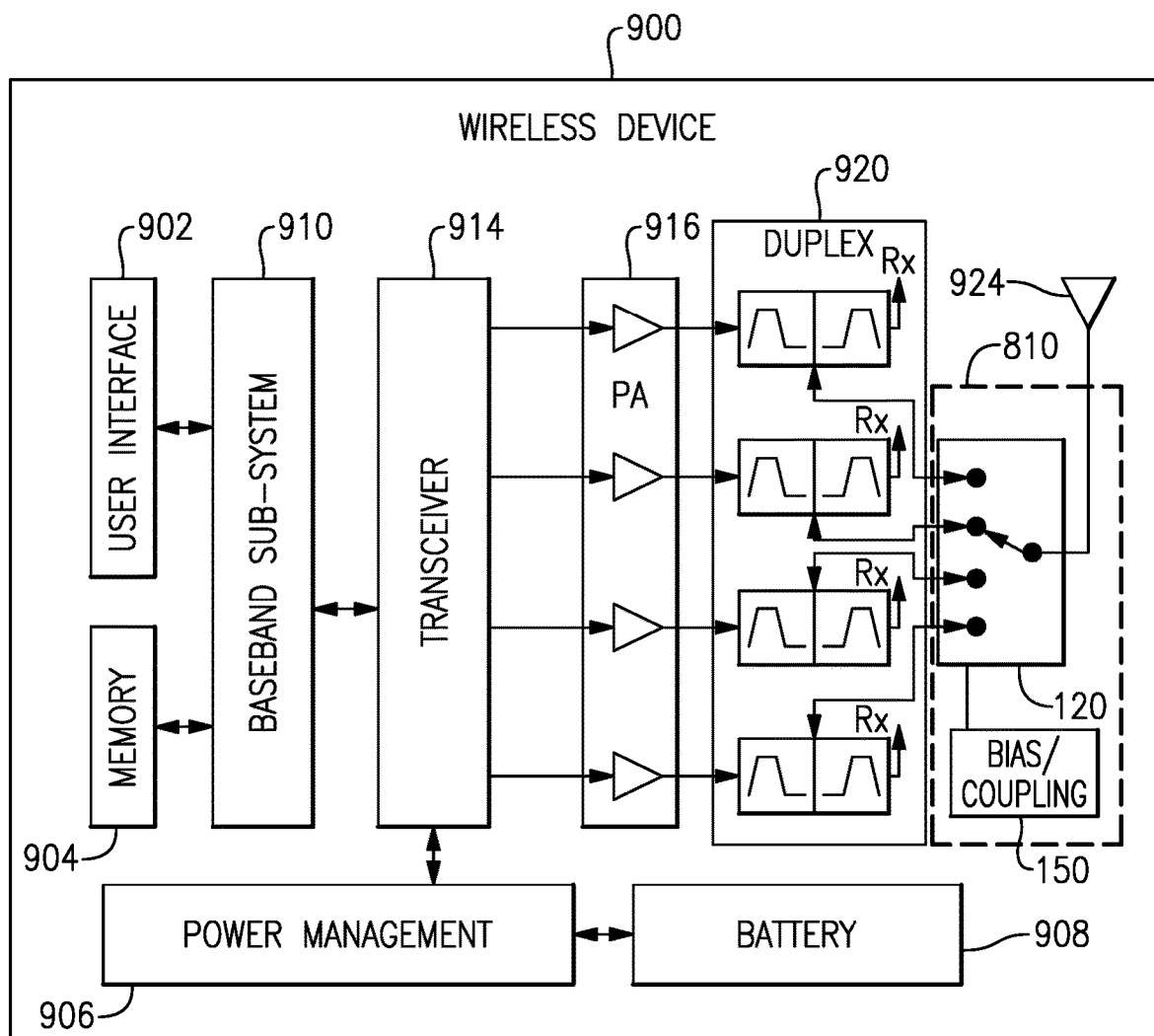
FIG. 19 shows a schematic diagram of an example wireless device having one or more advantageous features described herein.

FIG. 19 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band multip-mode operation of the wireless device 900.

In the example wireless device 900, a power amplifier (PA) module 916 having a plurality of PAs can provide an amplified RF signal to the switch 120 (via a duplexer 920), and the switch 120 can route the amplified RF signal to an antenna. The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 920 can allow transmit and receive operations to be performed simultaneously using a common antenna (e.g., 924). In FIG. 19, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined such that multiple steps and/or phases illustrated in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those illustrated and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general-purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general-purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations illustrated and described herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switching device comprising:
an assembly of source, gate, and drain implemented on an active region;
a first body contact implemented at a first end of the assembly; and
a second body contact implemented at a second end of the assembly, the second end distal from the first end along a width of the radio-frequency switching device, the first body contact and the second body contact coupled to a diode separate from the assembly, the first body contact coupled to a first end of the diode and the second body contact coupled to a second end of the diode.

2. The radio-frequency switching device of claim 1 wherein the diode is a P-N junction diode.

3. The radio-frequency switching device of claim 1 wherein the diode is a PMOS field-effect transistor.

4. A radio-frequency module comprising:
a packaging substrate configured to receive a plurality of devices; and
a die mounted on the packaging substrate, the die including a radio-frequency switching device having an assembly of source, gate, and drain implemented on an active region, the radio-frequency switching device further including a first body contact implemented at a first end of the assembly and a second body contact implemented at a second end of the assembly, the second end distal from the first end along a width of the radio-frequency switching device, the first body contact and the second body contact coupled to a diode separate from the assembly, the first body contact coupled to a first end of the diode and the second body contact coupled to a second end of the diode.

5. The radio-frequency module of claim 4 wherein the radio-frequency module is a switch module.

6. The radio-frequency module of claim 4 wherein the die is a silicon-on-insulator (SOI) die.

7. The radio-frequency module of claim 4 wherein the diode is a P-N junction diode.

8. The radio-frequency module of claim 4 wherein the diode is a PMOS field-effect transistor.

9. A wireless device comprising:
- a transceiver configured to process radio-frequency signals;
- a radio-frequency module in communication with the transceiver, the radio-frequency module including a radio-frequency switching device including an assembly of source, gate, and drain implemented on an active region, the radio-frequency switching device further including a first body contact implemented at a first end of the assembly and a second body contact implemented at a second end of the assembly, the second end distal from the first end along a width of the radio-frequency switching device, the first body contact and the second body contact coupled to a diode separate from the assembly, the first body contact coupled to a first end of the diode and the second body contact coupled to a second end of the diode; and
- an antenna in communication with the radio-frequency module, the antenna configured to facilitate transmitting and/or receiving of the radio-frequency signals.

10. The wireless device of claim 9 wherein the radio-frequency module is a switch module.

11. The wireless device of claim 9 wherein the diode is a P-N junction diode.

12. The wireless device of claim 9 wherein the diode is a PMOS field-effect transistor.

* * * * *